United States Patent
Lange, Sr. et al.

(10) Patent No.: US 6,194,655 B1
(45) Date of Patent: Feb. 27, 2001

(54) CIRCUIT BOARD COMPONENT SHIELDING ENCLOSURE AND ASSEMBLY HAVING OPPOSING COVERS INTERFITTED WITH UPPER AND LOWER PORTIONS OF ENCLOSURE

(75) Inventors: William A. Lange, Sr.; William A. Lange, II; Louise M. Lange; Deborah L. Clements, all of Palm Harbor, FL (US)

(73) Assignee: Leader Tech, Inc., Tampa, FL (US)

(*) Notice: Subject to any disclaimer, the term of this patent is extended or adjusted under 35 U.S.C. 154(b) by 0 days.

(21) Appl. No.: 09/260,314

(22) Filed: Mar. 1, 1999

(51) Int. Cl.[7] .................................................. H05K 9/00
(52) U.S. Cl. ............................ 174/35 GC; 174/35 R; 361/816; 361/752
(58) Field of Search .......................... 174/35 R, 35 GC; 361/816, 818, 799, 800, 753, 752

(56) References Cited

U.S. PATENT DOCUMENTS

| | | | |
|---|---|---|---|
| 3,721,746 | 3/1973 | Knappenberger | 174/35 MS |
| 3,806,767 | 4/1974 | Lehrfeld | 317/101 CC |
| 4,370,515 | 1/1983 | Donaldson | 174/35 R |
| 4,404,617 | 9/1983 | Ohyama et al. | 361/424 |
| 4,754,101 | 6/1988 | Stickney et al. | 174/35 R |
| 4,841,414 | 6/1989 | Hibino et al. | 361/424 |
| 4,890,199 | 12/1989 | Beutler | 361/424 |
| 5,014,160 | 5/1991 | McCoy, Jr. | 361/424 |
| 5,029,254 | 7/1991 | Stickney | 174/35 GC |
| 5,043,848 | 8/1991 | Rogers et al. | 361/424 |
| 5,095,177 | 3/1992 | Johnson | 174/35 R |
| 5,160,807 | 11/1992 | Fry et al. | 174/35 R |
| 5,175,395 | 12/1992 | Moore | 174/35 R |
| 5,184,283 | 2/1993 | Hamel | 361/395 |
| 5,354,951 | 10/1994 | Lange, Sr. et al. | 174/35 R |
| 6,002,086 | * 12/1999 | Yajima | 174/35 R |

FOREIGN PATENT DOCUMENTS

| | | |
|---|---|---|
| 3736833 | 5/1989 | (DE) . |
| 131548 | 6/1988 | (JP) . |
| 62595 | 3/1991 | (JP) . |

* cited by examiner

Primary Examiner—Kristine Kincaid
Assistant Examiner—Hung V Ngo
(74) Attorney, Agent, or Firm—Flanagan & Flanagan; John R. Flanagan; John K. Flanagan

(57) ABSTRACT

An electromagnetic interference shielding assembly includes an enclosure and top and bottom covers. The enclosure has interconnected walls arranged in a polygonal configuration to surround an electronic component on a circuit board. Each wall has upper and lower portions extending in opposite directions. The enclosure has upper and lower releasable attachment arrangements respectively formed in the upper and lower portions of the walls and releasably engaged with the top and bottom covers. The upper and lower attachment arrangements are substantially mirror images of one another and define upper and lower annular channels that are open respectively from above and below. Each of the top and bottom covers has a main portion and side portions attached to and extending from the main portion and arranged in a polygonal configuration matching that of the walls of the enclosure. The side portions of top and bottom covers are removably inserted into the corresponding upper and lower annular channels and into frictional fitting relation with the upper and lower portions of the enclosure to thereby removably mount the covers to the enclosure.

29 Claims, 2 Drawing Sheets

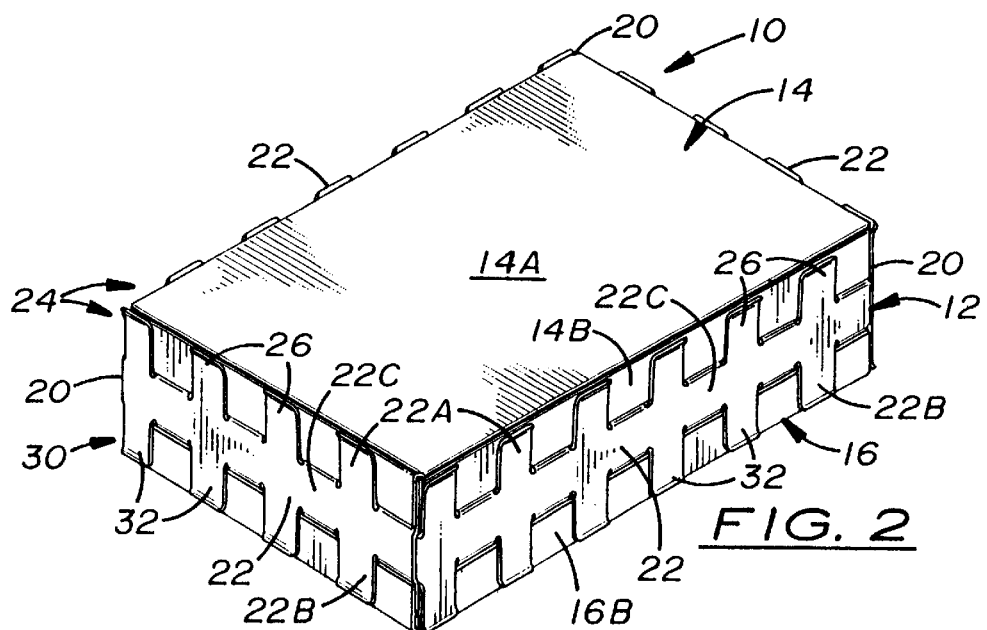
FIG. 2
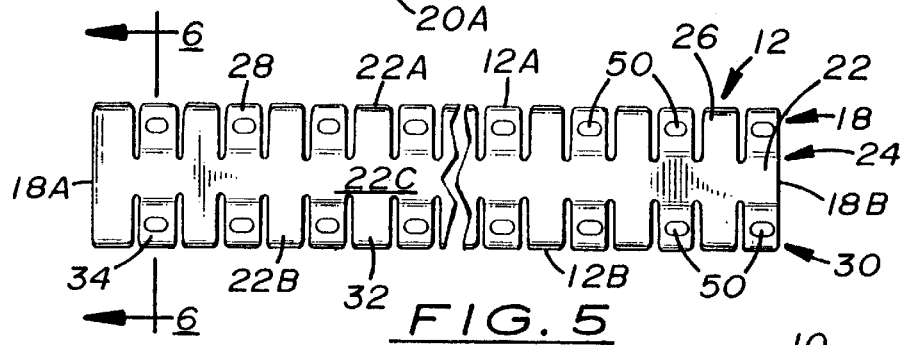
FIG. 5
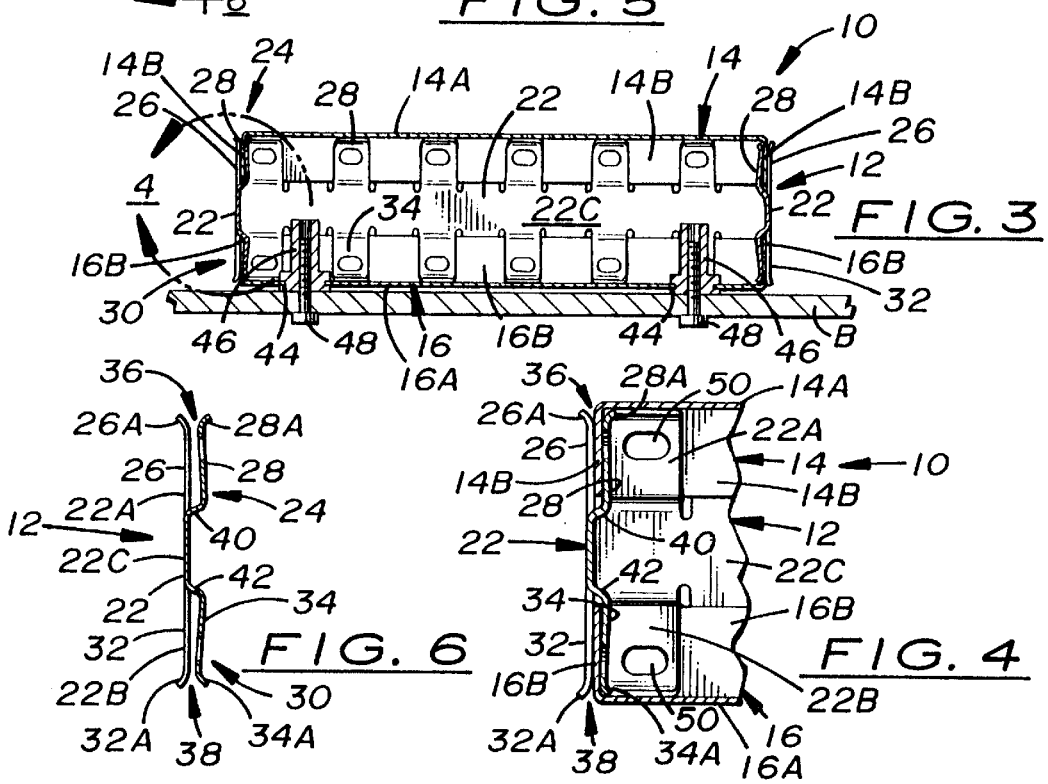
FIG. 3
FIG. 6
FIG. 4

CIRCUIT BOARD COMPONENT SHIELDING ENCLOSURE AND ASSEMBLY HAVING OPPOSING COVERS INTERFITTED WITH UPPER AND LOWER PORTIONS OF ENCLOSURE

BACKGROUND OF THE INVENTION

1. Field of the Invention

The present invention generally relates to shielding devices for minimizing electromagnetic interference and, more particularly, is concerned with an enclosure and an assembly employing the enclosure and opposing covers interfitted with releasable attachment means defined on opposite upper and lower portions of the enclosure which provide for effective shielding of circuit board components against electromagnetic interference.

2. Description of the Prior Art

Electronic components found in various types of transmitters, receivers, computers and other electronic devices emit or are susceptible to electromagnetic radiation. It is therefore desirable to shield circuit components to reduce undesirable electromagnetic interference (EMI) and/or susceptibility effects with the use of conductive shields that reflect or dissipate electromagnetic charges and fields. Such shields are generally grounded to allow electrical charges and fields to be dissipated without disrupting the operation of the electronic components enclosed within the shield.

Various types of shielding devices for electronic components mounted on printed circuit boards have been proposed in the prior art. Representative examples of such shielding devices are those disclosed in U.S. Pat. No. 4,754,101 to Stickney et al., U.S. Pat. No. 4,841,414 to Hibino et al., U.S. Pat. No. 5,014,160 to McCoy, Jr., U.S. Pat. No. 5,043,848 to Rogers et al., U.S. Pat. No. 5,095,177 to Johnson, U.S. Pat. No. 5,160,807 to Fry et al., U.S. Pat. No. 5,175,395 to Moore, U.S. Pat. No. 5,354,951 to Lange, Sr. et al., Japan Pat. No. 62,595 to Tsunoda and German Pat. No. 3,736,833 to Bardon. These shielding devices frequently include a base frame which is mounted to a printed circuit board and surrounds circuit board components and a cover which fits over and connects with the base frame and encloses the printed circuit board components.

Various difficulties may be encountered with respect to providing a satisfactory connection of the cover to the base frame. The connection must secure the cover to the base frame in a reliable manner which prevents dislodgement due to shock and vibration. At the same time, the connection must permit easy removal of the cover for periodic visual inspection of the components enclosed by the shield.

The one shielding assembly disclosed in U.S. Pat. No. 5,354,951 to Lange, Sr. et al., and assigned to the assignee of the present invention, has a connection configuration which has been found to be highly satisfactory in releasably securing a top cover to an enclosure of the shielding assembly. The enclosure of the shielding assembly of this patent includes a plurality of interconnected walls for surrounding an electronic component on a circuit board, a plurality of mounting pins attached to lower portions of the walls for attachment to the circuit board, and a plurality of outer and inner tabs formed in upper portions of the walls for releasably mounting the top cover thereto. The tabs are disposed in a spaced, alternating and offset relationship to one another along the upper portions of the walls so as to create an annular channel between the outer and inner tabs extending along the upper portions of the walls. The top cover has side portions which are removably insertable into the annular channel of the upper portions of the walls of the assembly and into a frictional fitting relation therewith to thereby removably mount the top cover over the enclosure and provide an effective electromagnetic interference shield for the electronic component.

It has been perceived by the inventors herein that a continuing need still exists for improvements in the design of shielding devices for circuit board components that will adapt such devices for use in other applications.

SUMMARY OF THE INVENTION

The present invention provides a circuit board component shielding enclosure and assembly designed to satisfy the aforementioned need. The shielding assembly of the present invention employs an enclosure of the present invention and a pair of top and bottom covers which frictionally interfit with releasable attachment arrangements formed on upper and lower portions of the enclosure so as to accomplish effective EMI shielding of components while allowing the covers to be easily fitted to the enclosure and removed from the enclosure for component accessibility. The upper and lower releasable attachment arrangements preferably are substantially mirror images of one another and thereby secure the top and bottom covers on the enclosure by employing substantially equivalent forces.

Accordingly, the present invention is directed to an EMI shielding enclosure which comprises: (a) a plurality of interconnected walls made of electrically conductive material and being arranged in a polygonal configuration to surround an electronic component on a substrate, each of the walls having an upper portion and a lower portion extending in opposite directions; (b) an upper releasable attachment arrangement formed in the upper portions of the respective walls and adapted for engagement with a top cover when in a first orientation; and (c) a lower releasable attachment arrangement formed in the lower portions of the respective walls and adapted for engagement with a bottom cover when in a second orientation being the inverse of the first orientation of the top cover, the upper and lower releasable attachment arrangements being substantially mirror images of one another.

Further, the upper releasable attachment arrangement includes an upper plurality of outer and inner tabs disposed in spaced, alternating and offset relationship with respect to one another along the upper portions of the walls so as to create an upper annular channel between the upper outer and inner tabs extending along the upper portions of the walls, the upper annular channel being open from above so as to adapt the upper annular channel to receive a downward extending edge of the top cover in the upper annular channel in engagement between the upper outer and inner tabs. The lower releasable attachment arrangement includes a lower plurality of outer and inner tabs disposed in spaced, alternating and offset relationship with respect to one another along the lower portions of the walls so as to create a lower annular channel between the lower outer and inner tabs extending along the lower portions of the walls, the lower annular channel being open from below so as to adapt the lower annular channel to receive an upward extending edge of the bottom cover in the lower annular channel in engagement between the lower outer and inner tabs.

More particularly, each of the walls is substantially planar and has a middle portion between the upper and lower portions. The upper and lower outer tabs in the respective upper and lower portions of each of the walls are integrally connected with the middle portion of the wall and extend substantially in a common plane with the middle portion of the wall. The upper outer tabs have upper ends and the lower outer tabs have lower ends which are flared so as to extend outwardly beyond the common plane of the wall. The upper and lower inner tabs in the respective upper and lower portions of each of the walls are also integrally connected to the middle portion of the wall and disposed in an inwardly offset fashion from the upper and lower outer tabs and extend inwardly and in opposite directions from the middle portion of the wall. The upper inner tabs have upper ends and the lower inner tabs have lower ends which are flared so as to extend inwardly beyond the upper and lower inner tabs.

The present invention is also directed to an EMI shielding assembly which comprises: (a) the above-defined enclosure; and (b) the aforementioned top and bottom covers. The top and bottom covers preferably are substantially identical in configuration to one another. Each of the top and bottom covers is made of electrically conductive material and has a main portion and a plurality of side portions attached to and extending outwardly therefrom and arranged in a polygonal configuration about the main portion matching that of the interconnected walls of the enclosure. The side portions of each of the top and bottom covers are inserted into the corresponding one of the upper and lower annular channels defined by the respective one of the upper and lower pluralities of outer and inner tabs and into a frictional fitting relation therewith to thereby removably mount the top and bottom covers to the enclosure so as to provide the electromagnetic interference shield for the electronic component.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which:

FIG. 2 is an assembled perspective view of the assembly of FIG. 1.

FIG. 3 is a vertical sectional view of the assembly of FIG. 2, showing the assembly mounted upon a substrate, such as a circuit board.

FIG. 4 is an enlarged fragmentary detailed view of the portion of the assembled enclosure and covers encompassed by circle 4 of FIG. 3.

FIG. 5 is a side elevational view of a strip of metallic material from which is formed the enclosure of the assembly of FIG. 1.

FIG. 6 is an enlarged vertical sectional view of the strip taken along line 6—6 of FIG. 5.

DETAILED DESCRIPTION OF THE INVENTION

Figure 1:
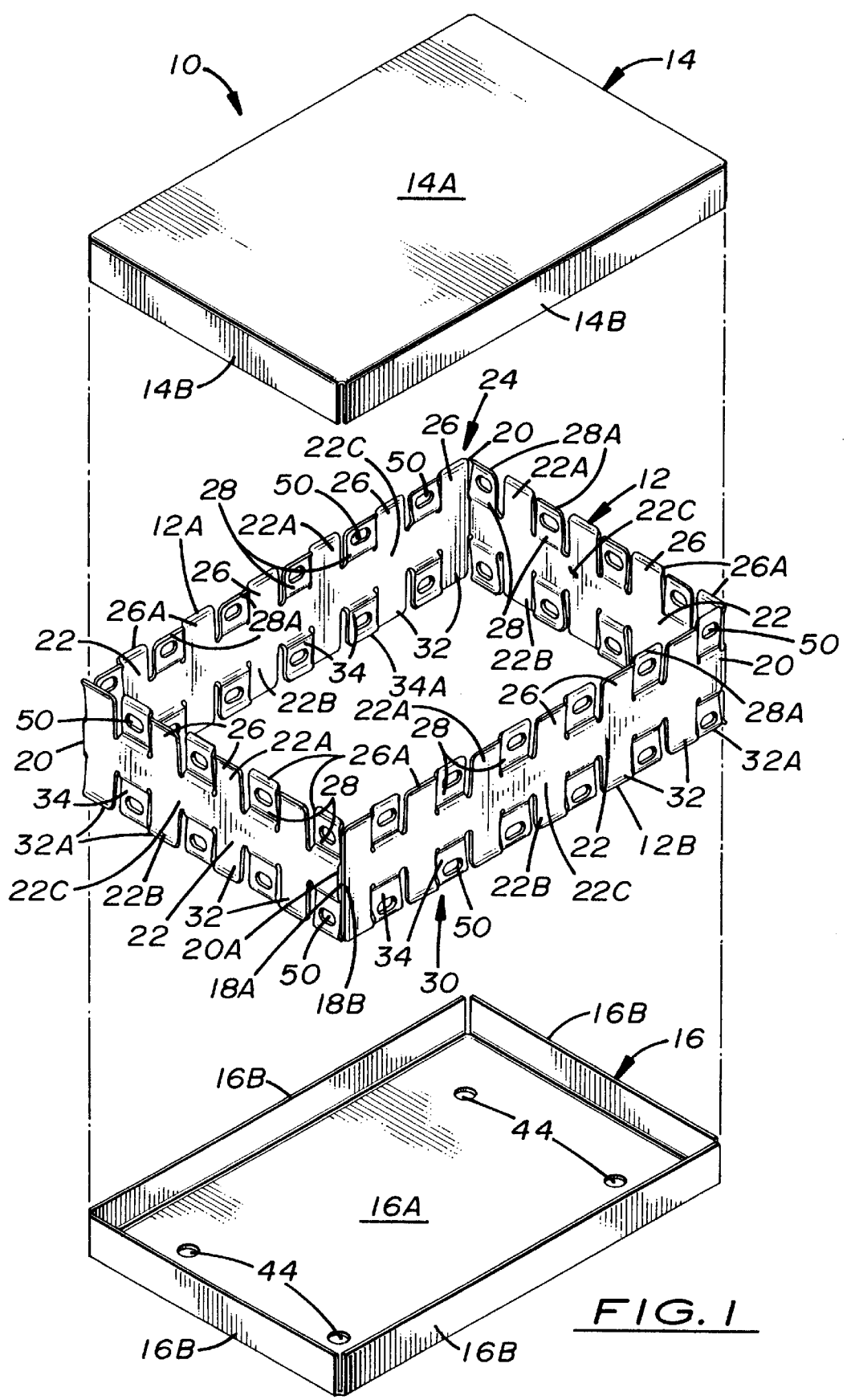
FIG. 1 is an exploded perspective view of a circuit board component shielding assembly of the present invention having a middle enclosure and top and bottom covers for releasably interfitting on opposite upper and lower portions of the enclosure.

Referring to the drawings and particularly to FIGS. 1 to 3, there is illustrated a circuit board component EMI shielding assembly, generally designated 10, of the present invention. Basically, the shielding assembly 10 includes an elongated fence or enclosure 12 of the present invention and a pair of top and bottom covers 14, 16 fitted over and substantially closing open upper and lower ends 12A, 12B of the enclosure 12. The enclosure 12 and top and bottom covers 14, 16 are preferably made of a suitable electrically conductive material, such as a conductive metal. The top and bottom covers 14, 16 preferably are substantially identical in configuration to one another.

Referring to FIGS. 1 to 4, the enclosure 12 of the EMI shielding assembly 10 is defined by an elongated generally planar bendable strip 18 of material which is bent at spaced apart locations to define corners 20 of the enclosure 12 and a plurality of generally planar walls 22 extending between and interconnected by the corners 20. The opposite ends 18A, 18B of the strip 18 remain unconnected and are merely positioned adjacent to one another to form an unconnected one 20A of the corners 20. The walls 22 are thus arranged in a polygonal, and preferably rectangular, configuration so as to adapt the enclosure 12 to surround an electronic component (not shown) mounted on a substrate B, such as a circuit board, as seen in FIG. 3. Each of the walls 22 is substantially planar and includes opposite upper and lower portions 22A, 22B and a middle portion 22C disposed between and integrally connected with the upper and lower portions 22A, 22B. The upper and lower portions 22A, 22B extending in opposite directions from the middle portion 22C of each wall 22.

Referring now to FIGS. 1 to 6, the enclosure 12 includes an upper plurality 24 of outer and inner tabs 26, 28 and a lower plurality 30 of outer and inner tabs 32, 34. The upper outer and inner tabs 26, 28 of the upper plurality 24 are formed in upper portions 22A of the walls 22. The lower outer and inner tabs 32, 34 of the lower plurality 30 are formed in lower portions 22B of the walls 22. The upper outer and inner tabs 26, 28 extend upwardly from the middle portions 22C of the walls 22. The lower outer and inner tabs 32, 34 extend downwardly from the middle portions 22C of the walls 22. Furthermore, the upper outer and inner tabs 26, 28 of the upper plurality 24 are disposed in a spaced apart, alternating and offset relationship with respect to one another along the upper portions 22A of the walls 22 so as to create an elongated continuous upper annular channel 36 between the upper outer and inner tabs 26, 28. The lower outer and inner tabs 32, 34 of the lower plurality 30 are disposed in a spaced apart, alternating and offset relationship with respect to one another along the lower portions 22B of the walls 22 so as to create an elongated continuous lower annular channel 38 between the lower outer and inner tabs 32, 34. The upper and lower annular channels 36, 38 extend around the enclosure 12 respectively along the upper and lower portions 22A, 22B of the interconnected walls 20 and are respectively open from above and below to receive the top and bottom covers 14, 16 when disposed in first and second orientations being the inverse of one another as seen in FIGS. 1 to 3.

More particularly, the upper and lower outer tabs 26, 32 in the respective upper and lower portions 20A, 20B of each of the walls 20 are integrally connected with the middle portion 20C of the wall 20 and extend substantially in a common plane therewith. The upper and lower inner tabs 28, 34 in the respective upper and lower portions 20A, 20B of each of the walls 20 are also integrally connected to the middle portion 20C of the wall 20 and disposed in an inwardly offset fashion from the upper and lower outer tabs 26, 32 and extend inwardly and in opposite directions upwardly and downwardly from the middle portion 20C of the wall 20. The upper outer tabs 26 have upper ends 26A and the lower outer tabs 32 have lower ends 32A which are flared so as to extend outwardly beyond the common plane of the wall 20, as seen in FIG. 6. The upper inner tabs 28 have upper ends 28A and the lower inner tabs 34 have lower ends 34A which are flared so as to extend inwardly beyond the upper and lower inner tabs 28, 34, as seen in FIG. 6. The respectively outwardly and inwardly flared ends 26A, 32A and 28A, 34A make it relatively easy to insert the respective top and bottom covers 14, 16 downwardly and upwardly into the corresponding upper and lower annular channels 36, 38. The outer tabs 26, 32 do not outwardly deflect to any significant degree when the top and bottom covers 14, 16 are inserted into and removed from the corresponding annular channels 36, 38. Most of the deflection occurs in the offset inner tabs 28, 34. The inner tabs 28, 34 are made by a conventional forming operation wherein portions of the upper and lower portions 20A, 20B of the walls 20 are cutout between the inner and outer tabs 26, 32 and 28, 34 and then the inner tabs 28, 34 are bent about two spaced parallel locations 28A, 28B and 34A, 34B thereon to place them in the offset relationship to the wall 20. The lower inwardly extending portions of the upper inner tabs 28 where they are integrally connected to the wall 20 provide positive downward stops 40 which prevent overinsertion of the top cover 14 onto the enclosure 12. The upper inwardly extending portions of the lower inner tabs 34 where they are integrally connected to the wall 20 provide positive upward stops 42 which prevent overinsertion of the bottom cover 16 onto the enclosure 12.

Referring to FIGS. 1 to 4, each of the top and bottom covers 14, 16 of the shielding assembly 10 has a main portion 14A, 16A and a plurality of side portions 14B, 16B integrally attached to and depending respectively downwardly and upwardly from the main portion 14A, 16A. The side portions 16B are arranged in a polygonal, preferably rectangular, configuration matching that of the interconnected walls 20 of the enclosure 12. The perimeter size of each of the top and bottom covers 14, 16 is matched with that of a corresponding one of the upper and lower annular channels 36, 38 so as to permit the side portions 14B, 16B of the respective top and bottom covers 14, 16 to be removably inserted into the corresponding one of the upper and lower annular channels 36, 38 and into a frictional fitting engagement between the upper outer and inner tabs 26, 28 and lower outer and inner tabs 32, 34 to thereby removably mount the top and bottom covers 14, 16 to and over the upper and lower ends 12A, 12B of the enclosure 12, as seen in FIGS. 2 and 3, and provide an EMI shield for the electronic component (not shown) enclosed by the shielding assembly 10. The pair of covers 14 and the enclosure 12 together provide a complete EMI shield for the electronic component.

Optional features which can be employed in the shielding assembly 10 includes a plurality of apertures 44 defined in main portion 16A of the bottom cover 16 which receive couplers 46 attachable by screws 48 to the substrate B. Optional features can also include a plurality of dimples (not shown) formed on the side portions 14B, 16B of the top and bottom covers 14, 16 and holes 50 formed through the upper and lower inner tabs 28, 34 of the enclosure 12. The dimples of the top and bottom covers 14, 16 would interengage with selected ones of the holes 50 of the inner tabs 28, 34 of the enclosure 12 and thereby provide a releasable snap-in lock connection in addition to the frictionally fitted connection. The releasable snap-in lock connection may be desirable in applications where the shielding assembly 10 will be subject to severe vibrations.

It is thought that the present invention and its advantages will be understood from the foregoing description and it will be apparent that various changes may be made thereto without departing from the spirit and scope of the invention or sacrificing all of its material advantages, the form hereinbefore described being merely preferred or exemplary embodiment thereof.

We claim:
1. An electromagnetic interference shielding enclosure, comprising:
(a) a plurality of interconnected walls made of electrically conductive material and being arranged in a polygonal configuration to surround an electronic component on a substrate, each of said walls having an upper portion and a lower portion extending in opposite directions;
(b) an upper releasable attachment arrangement formed in said upper portions of said respective walls and adapted for engagement with a top cover in a first orientation, said upper releasable attachment arrangement including an upper plurality of outer and inner tabs disposed in spaced, alternating and offset relationship with respect to one another along said upper portions of said walls so as to create an upper annular channel between said upper outer and inner tabs extending along said upper portions of said walls, said upper annular channel being open from above so as to adapt said upper annular channel to receive a downward extending edge of the top cover in said upper annular channel in engagement between said upper outer and inner tabs; and
(c) a lower releasable attachment arrangement formed in said lower portions of said respective walls and adapted for engagement with a bottom cover in a second orientation being the inverse of the first orientation of the top cover, said upper and lower releasable attachment arrangements being substantially mirror images of one another.

2. The enclosure of claim 1 wherein:
each of said wall s is substantially planar and has a middle portion between said upper and lower portions;
said upper outer tabs in said upper portion of each of said walls are integrally connected with said middle portion of said wall and extend substantially in a common plane with said middle portion of said wall.

3. The enclosure of claim 2 wherein said upper outer tabs have upper ends which are flared so as to extend outwardly beyond said common plane of said wall.

4. The enclosure of claim 2 wherein said upper inner tabs in said upper portion of each of said walls are integrally connected to said middle portion of said wall and disposed in an inwardly offset fashion from said upper outer tabs and extend inwardly and upwardly from said middle portion of said wall.

5. The enclosure of claim 4 wherein said upper inner tabs have upper ends which are flared so as to extend inwardly beyond said upper inner tabs.

6. An electromagnetic interference shielding enclosure, comprising:
(a) a plurality of interconnected walls made of electrically conductive material and being arranged in a polygonal configuration to surround an electronic component on a substrate, each of said walls having an upper portion and a lower portion extending in opposite directions:
(b) an upper releasable attachment arrangement formed in said upper portions of said respective walls and adapted for engagement with a top cover in a first orientation: and (c) a lower releasable attachment arrangement formed in said lower portions of said respective walls and adapted for engagement with a bottom cover in a second orientation being the inverse of the first orientation of the top cover, said upper and lower releasable attachment arrangements being substantially mirror images of one another, said lower releasable attachment arrangement including a lower plurality of inner and outer tabs disposed in spaced, alternating and offset relationship with respect to one another along said lower portions of said walls so as to create a lower annular channel between said lower outer and inner tabs extending along said lower portions of said walls, said lower annular channel being open from below so as to adapt said lower annular channel to receive an upward extending edge of the bottom cover in said lower annular channel in engagement between said lower outer and inner tabs.

7. The enclosure of claim 6 wherein:

each of said walls is substantially planar and has a middle portion between said upper and lower portions;

said lower outer tabs in said lower portion of each of said walls are integrally connected with said middle portion of said wall and extend substantially in a common plane with said middle portion of said wall.

8. The enclosure of claim 7 wherein said lower outer tabs have lower ends which are flared so as to extend outwardly beyond said common plane of said wall.

9. The enclosure of claim 7 wherein said lower inner tabs in said lower portion of each of said walls are integrally connected to said middle portion of said wall and disposed in an inwardly offset fashion from the lower outer tabs and extend inwardly and downwardly from said middle portion of said wall.

10. The enclosure of claim 9 wherein said lower inner tabs have lower ends which are flared so as to extend inwardly beyond said lower inner tabs.

11. An electro magnetic interference shielding enclosure, comprising:

(a) a plurality of interconnected walls made of electrically conductive material and being arranged in a polygonal configuration to surround an electronic component on a substrate, each of said walls having an upper portion and a lower portion extending in opposite directions;

(b) an upper plurality of outer and inner tabs formed in said upper portions of said respective walls, said upper outer and inner tabs being disposed in spaced, alternating and offset relationship with respect to one another along said upper portions of said walls so as to create an upper annular channel between said upper outer and inner tabs extending along said upper portions of said walls, said upper annular channel being open from above so as to adapt said upper annular channel to receive a downward extending edge of a top cover in said upper annular channel in engagement between said upper outer and inner tabs when the top cover is in a first orientation; a nd (c) a lower plurality of outer and inner tabs formed in said lower portions of said respective walls, said lower outer and inner tabs being disposed in spaced, alternating and off s et relationship with respect to one another along said lower portions of said walls so as to create a lower annular channel between said lower outer and inner tabs extending along said lower portions of said walls, said lower annular channel being open from below so as to adapt said lower annular channel to receive an upward extending edge of a bottom cover in said lower annular channel in engagement between said lower outer and inner tabs when th e bottom cover is in a second orientation being the inverse of the first orientation of the top cover.

12. The enclosure of claim 11 wherein said lower plurality of outer and inner tabs is substantially a mirror image of said upper plurality of outer and inner tabs.

13. The enclosure of claim 11 wherein:

each of said walls is substantially planar and has a middle portion between said upper and lower portions;

said upper outer tabs in said upper portion of each of said walls are integrally connected with said middle portion of said wall and extend substantially in a common plane with said middle portion of said wall.

14. The enclosure of claim 13 wherein said upper inner tabs in said upper portion of each of said walls are integrally connected to said middle portion of said wall and are disposed in an inwardly offset fashion from said upper outer tabs and extend inwardly and upwardly from said middle portion of said wall.

15. The enclosure of claim 13 wherein said lower outer tabs in said lower portion of each of said walls are integrally connected with said middle portion of said wall and extend substantially in a common plane with said middle portion and said upper outer tabs of said wall.

16. The enclosure of claim 15 wherein said lower inner tabs in said lower portion of each of said walls are integrally connected to said middle portion of said wall and disposed in an inwardly offset fashion from said lower outer tabs and extend inwardly and downwardly from said middle portion of said wall.

17. An electromagnetic interference shielding assembly, comprising:

(a) a top cover disposed in a first orientation, made of an electrically conductive material and having a main portion and a plurality of side portions attached to and extending outwardly in a common direction therefrom;

(b) a bottom cover disposed in a second orientation being the inverse of said first orientation of said top cover; and (c) an enclosure including (i) a plurality of interconnected walls made of electrically conductive material and being arranged in a polygonal configuration to surround an electronic component on a substrate, each of said walls having an upper portion and a lower portion extending in opposite directions, said side portions of said top cover being arranged in a polygonal configuration about said main portion of said top cover matching said polygonal configuration of said walls of said enclosure, (ii) an upper releasable attachment arrangement formed in said upper portions of said respective walls and releasably engaged with said top cover, said upper releasable attachment arrangement including an upper plurality of outer and inner tabs disposed in spaced, alternating and offset relationship with respect to one another along said upper portions of said walls so as to create an upper annular channel between said upper outer and inner tabs extending along said upper portions of said walls, said upper annular channel being open from above so as to receive said side portions of said top cover in said upper annular channel in engagement between said upper outer and inner tabs, and (iii) a lower releasable attachment arrangement formed in said lower portions of said respective walls and releasably engaged with said bottom cover, said upper and lower releasable attachment arrangements being substantially mirror images of one another.

18. The assembly of claim 17 wherein said bottom cover is made of electrically conductive material and has a main portion and a plurality of side portions attached to and extending outwardly in a common direction therefrom and arranged in a polygonal configuration about said main portion matching said polygonal configuration of said walls of said enclosure.

19. The assembly of claim 16 wherein said top and bottom covers are substantially identical in configuration to one another.

20. The assembly of claim 17 wherein:
each of s aid walls of said enclosure is substantially planar and has a middle portion between said upper and lower portions;
said upper outer tabs in said upper portion of each of said walls are integrally connected with said middle portion of said wall and extend substantially in a common plane with said middle portion of said wall.

21. The assembly of claim 20 wherein said upper inner tabs in said upper portion of each of said walls of said enclosure are integrally connected to said middle portion of said wall and disposed in an inwardly offset fashion from said upper outer tabs and extend inwardly and upwardly from said middle portion of said wall.

22. The assembly of claim 21 wherein said upper inner tabs in said upper portion of each of said walls of said enclosure have bends at least at two spaced locations therein defining positive stops which prevent overinsertion of said top cover into said upper annular channel of said enclosure.

23. The assembly of claim 18 wherein:
said interconnected walls of said enclosure defining open opposite upper and lower ends of said enclosure;
said upper releasable attachment arrangement being releasably engaged with said top cover such that said top cover substantially closes said open upper end of said enclosure; and
said lower releasable attachment arrangement being releasably engaged with said bottom cover such that said bottom cover substantially closes said open lower end of said enclosure.

24. An electromagnetic interference shielding assembly, comprising:
(a) a top cover disposed in a first orientation;
(b) a bottom cover disposed in a second orientation being the inverse of said first orientation of said top cover, made of an electrically conductive material and having a main portion and a plurality of side portions attached to and extending outwardly in a common direction therefrom; and
(c) an enclosure including
(i) a plurality of interconnected walls made of electrically conductive material and being arranged in a polygonal configuration to surround an electronic component on a substrate, each of said walls having an upper portion and a lower portion extending in opposite directions, said side portions of said bottom cover being arranged in a polygonal configuration about said main portion of said bottom cover matching said polygonal configuration of said walls of said enclosure,
(ii) an upper releasable attachment arrangement formed in said upper portions of said respective walls and releasably engaged with said top cover, and
(iii) a lower releasable attachment arrangement formed in said lower portions of said respective walls and releasably engaged with said bottom cover, said upper and lower releasable attachment arrangements being substantially mirror images of one another, said lower releasable attachment arrangement including a lower plurality of inner and outer tabs disposed in spaced, alternating and offset relationship with respect to one another along said lower portions of said walls so as to create a lower annular channel between said lower inner and outer tabs extending along said lower portions of said walls, said lower annular channel being open from below so as to receive said side portions of said bottom cover in said lower annular channel in engagement between said lower outer and inner tabs.

25. The assembly of claim 22 wherein said top cover is made of electrically conductive material and has a main portion and a plurality of side portions attached to and extending outwardly in a common direction therefrom and arranged in a polygonal configuration about said main portion matching said polygonal configuration of said walls of said enclosure.

26. The assembly of claim 25 wherein said upper releasable attachment arrangement of said enclosure includes an upper plurality of outer and inner tabs disposed in spaced, alternating and offset relationship with respect to one another along said upper portions of said walls so as to create an upper annular channel between said upper outer and inner tabs extending along said upper portions of said walls, said upper annular channel being open from above so as to receive said side portions of said top cover in said upper annular channel in engagement between said upper outer and inner tabs.

27. The assembly of claim 24 wherein:
each of said walls of said enclosure is substantially planar and has a middle portion between said upper and lower portions;
said lower outer tabs in said lower portion of each of said walls are integrally connected with said middle portion of said wall and extend substantially in a common plane with said middle portion of said wall.

28. The assembly of claim 27 wherein said lower inner tabs in said lower portion of each of said walls are integrally connected to said middle portion of said wall and disposed in an inwardly offset fashion from said lower outer tabs and extend inwardly and downwardly from said middle portion of said wall.

29. The assembly of claim 28 wherein said lower inner tabs in said lower portion of each of said walls of said enclosure have bends at least at two spaced locations therein defining positive stops which prevent overinsertion of said bottom cover into said lower annular channel of said enclosure.

* * * * *